United States Patent
Simon

(10) Patent No.: US 12,351,002 B2
(45) Date of Patent: Jul. 8, 2025

(54) APPARATUS FOR DETERMINING THE TEMPERATURE OF A RESISTANCE HEATING DEVICE

(71) Applicant: GENTHERM GMBH, Odelzhausen (DE)

(72) Inventor: Dávid Szabolcs Simon, Budapest (HU)

(73) Assignee: GENTHERM GMBH, Odelzhausen (DE)

(*) Notice: Subject to any disclaimer, the term of this patent is extended or adjusted under 35 U.S.C. 154(b) by 865 days.

(21) Appl. No.: 17/606,534

(22) PCT Filed: May 29, 2020

(86) PCT No.: PCT/DE2020/000115
§ 371 (c)(1),
(2) Date: Oct. 26, 2021

(87) PCT Pub. No.: WO2020/239159
PCT Pub. Date: Dec. 3, 2020

(65) Prior Publication Data
US 2022/0194174 A1    Jun. 23, 2022

(30) Foreign Application Priority Data
May 29, 2019    (DE) .................... 10 2019 003 768.5

(51) Int. Cl.
*B60H 1/22*    (2006.01)
*G01K 1/14*    (2021.01)
(Continued)

(52) U.S. Cl.
CPC ............. *B60H 1/2218* (2013.01); *G01K 1/14* (2013.01); *G01R 27/02* (2013.01);
(Continued)

(58) Field of Classification Search
CPC .......... B60H 1/2218; B60H 2001/2231; B60H 2001/2256; G01K 1/14; G01R 27/02;
(Continued)

(56) References Cited

U.S. PATENT DOCUMENTS 5,075,537 A * 12/1991 Lorenzen ........... G05D 23/2401
   219/202
5,218,946 A    6/1993 Wild et al.
(Continued)

FOREIGN PATENT DOCUMENTS

EP    2805869 A1    11/2014

OTHER PUBLICATIONS

International Search Report and Written Opinion dated Nov. 6, 2020, for International Application No. PCT/DE2020/000115.

*Primary Examiner* — Tiffany T Tran
(74) *Attorney, Agent, or Firm* — The Dobrusin Law Firm, P.C.

(57) ABSTRACT

A device for determining a temperature of a resistance heating device, the device includes: a temperature sensor configured to detect the temperature of the resistance heating device; and an electronic data processing and/or control device configured to calculate a temperature change of the resistance heating device on a basis of a change in a resistance value of the resistance heating device and a relationship between the resistance value and the temperature of the resistance heating device, the electronic data processing and/or control device configured to validate the temperature of the resistance heating device detected by the temperature sensor, taking into account the calculated temperature change of the resistance heating device.

7 Claims, 2 Drawing Sheets

(51) Int. Cl.
*G01R 27/02* (2006.01)
*G05D 23/24* (2006.01)
*B60N 2/56* (2006.01)

(52) U.S. Cl.
CPC . *G05D 23/2401* (2013.01); *B60H 2001/2231* (2013.01); *B60H 2001/2256* (2013.01); *B60N 2/5685* (2013.01)

(58) Field of Classification Search
CPC .. G05D 23/2401; G05D 23/24; B60N 2/5685; H05B 1/0238
See application file for complete search history.

(56) References Cited

U.S. PATENT DOCUMENTS 5,229,579 A 7/1993 Ingraham et al.
2019/0338422 A1* 11/2019 Durbin .................. H05B 3/265

* cited by examiner

APPARATUS FOR DETERMINING THE TEMPERATURE OF A RESISTANCE HEATING DEVICE

PRIORITY

This application is a US National Stage entry of PCT/DE2020/000115 filed on May 29, 2020, which claims priority to DE 102019003768.5 filed on May 29, 2019, all of which are expressly incorporated by reference herein for all purposes.

FIELD

This application relates to a device for determining the temperature of a resistance heating device, having a temperature sensor designed to detect the temperature of the resistance heating device by sensor; to a heating system, particularly for use in a vehicle, having a resistance heating device and a device for determining the temperature of the resistance heating device; and to a method for operating a heating system having the step: detecting, by sensors, the temperature of a resistance heating device of the heating system by means of a temperature sensor of the heating system.

BACKGROUND

In modern vehicles, resistance heating devices having one or more heating wires are used in a large number of different applications in order to implement object or area temperature control. The use of corresponding resistance heating devices has established itself particularly in heated vehicle seats.

In order to monitor and/or regulate corresponding resistance heating devices, the temperature is detected by sensors on the resistance heating devices, so that a high degree of operational safety is guaranteed and a regulation mode that increases comfort is made possible. In the prior art, for example, NTC resistors are used as temperature sensors to detect the temperature of a resistance heating device.

In order to increase the operational safety of corresponding resistance heating devices, it is often necessary for the temperature measured value detected by sensor by the temperature sensor to be checked or validated in order to recognize any functional impairments of the temperature sensor. A malfunctioning temperature sensor provides control or regulation systems with incorrect temperature measurement values, which can result in an unintended temperature development for the user on the resistance heating device. This can lead to excessive heating of the contact surfaces, which creates a considerable risk of injury for the user. A malfunctioning temperature sensor can thus lead to burn injuries for the user, for example.

Either additional temperature sensors or temperature data from an external system are required to check or validate the temperature measured values of such temperature sensors. However, additional temperature sensors lead to increased manufacturing costs and increased system complexity. Temperature data from an external system is not available in a large number of use cases.

The use of the current resistance value of the resistance heating device has so far not been able to be used for the precise determination of the temperature of the resistance heating device. In addition to the temperature, the electrical resistance of a resistance heating device is also influenced by other influencing factors, such as damage, wear or manufacturing tolerances. It has not yet been possible to achieve reliable temperature detection by means of the electrical resistance value of the resistance heating device due to these influencing factors.

SUMMARY

The object on which the invention is based is thus to enable a check or validation of a temperature measurement value detected by sensors without the need for additional temperature sensors or temperature data from an external system.

The object is achieved by a device of the type mentioned at the beginning, wherein the device according to the invention has an electronic data processing and/or control device which is designed calculate a temperature change of the resistance heating device on the basis of a change in the resistance value of the resistance heating device and a relationship between the electrical resistance and the temperature of the resistance heating device and to validate a temperature of the resistance heating device detected by sensor by the temperature sensor, taking into account the calculated temperature change of the resistance heating device.

The invention makes use of the knowledge that it can be reliably checked whether the temperature sensor is working as expected and without errors by calculating a temperature change of the resistance heating device on the basis of a change in the resistance value of the resistance heating device. As a result of the validation based on a calculation, a temperature sensor can experience a malfunction or damage without the need for additional temperature sensors. This type of validation considerably increases the safety of the temperature detection without increasing manufacturing costs and without increasing the number of parts. A reliable and inexpensive plausibility check of the temperature value measured by the temperature sensor can take place.

The relationship between the electrical resistance and the temperature of the resistance heating device can be, for example, a resistance temperature characteristic curve. The electronic data processing and/or control device can be a microcontroller or comprise a microcontroller. The temperature sensor is preferably designed to be arranged and preferably attached to the resistance heating device or in the vicinity of the resistance heating device. The resistance heating device can be designed as a heating conductor system and comprise one or more heating conductors. The one or more heating conductors can be designed as heating wires.

In a preferred embodiment of the device according to the invention, the electronic data processing and/or control device is designed to validate the sensor-detected temperature of the resistance heating device to compare a sensor-detected temperature change of the resistance heating device with a calculated temperature change of the resistance heating device. The temperature change detected by sensor and/or the calculated temperature change of the resistance heating device preferably relate to a validation period of time. The temperature change is preferably a temperature increase during operation of the resistance heating device. Alternatively, the temperature change can also be a temperature decrease during operation of the resistance heating device. A large part of the possible functional errors can be detected by comparing the temperature changes detected by sensor and the calculated temperature changes. The detectable functional errors comprise, for example, a short circuit, an open circuit and impairment of the thermal coupling of the temperature sensor and the resistance heating device. The thermal coupling of the temperature sensor and the resistance heating device can be impaired, for example, by an unintentional detachment of the temperature sensor from the resistance heating device or by external heat input, for example, by external fluid flows. In addition, changes in the measurement properties of the temperature sensor and/or leakage currents can be detected by a partial or direct short circuit to an external circuit. In addition, a short circuit or an open circuit to switches in a higher-level electrical circuit can be identified. Dynamic or varying measurement deviations of the temperature sensor can particularly be detected by comparing the temperature changes detected by sensor and the calculated temperature changes.

In a further development of the device according to the invention, the relationship between the electrical resistance and the temperature of the resistance heating device used by the electronic data processing and/or control device is a device-specific relationship between the electrical resistance and the temperature of the resistance heating device determined specifically for the resistance heating device. It is possible for this device-specific relationship between the electrical resistance and the temperature of the resistance heating device to have been determined during a previous heating process or to be a specification of the manufacturer.

In another embodiment of the device according to the invention, the electronic data processing and/or control device is designed to determine and/or initially store the relationship between the electrical resistance and the temperature of the resistance heating device used for the temperature calculation, particularly as part of a setup routine. The electronic data processing and/or control device preferably has a memory in which a corresponding relationship between the electrical resistance and the temperature of the resistance heating device is or can be stored. The fact that the relationship between the electrical resistance and the temperature of the resistance heating device is determined as part of a setup routine means that the relationship is specifically adapted to the resistance heating device. As a result, manufacturing tolerances in the manufacture of the resistance heating device can be taken into account in the relationship between the electrical resistance and the temperature of the resistance heating device. The need to use a comparatively imprecise, unspecific general relationship between the electrical resistance and the temperature of the resistance heating device is thus overcome. The electronic data processing and/or control device thus allows an extremely precise calculation of the temperature change of the resistance heating device.

A device according to the invention is also advantageous in which the electronic data processing and/or control device is designed to subsequently change, particularly to update, the relationship between the electrical resistance and the temperature of the resistance heating device used for the temperature calculation. A new calibration or recalibration of the calculation routine is implemented by subsequently changing or updating the relationship between the electrical resistance and the temperature of the resistance heating device. An internal constant negative or positive temperature offset at the temperature sensor cannot be recognized by comparing the temperature changes detected by sensor and the calculated temperature changes, a constant measurement deviation, for example. A constant temperature offset, however, is detected as part of the updating of the relationship between the electrical resistance and the temperature of the resistance heating device. The electronic data processing and/or control device is preferably designed to automatically change or update the relationship between the electrical resistance and the temperature of the resistance heating device at regular or irregular intervals.

In another embodiment of the device according to the invention, the electronic data processing and/or control device is designed to derive the relationship between the electrical resistance and the temperature of the resistance heating device from at least two pairs of values, wherein a first pair of values assigns an associated first resistance value of the resistance heating device to a first temperature value of the resistance heating device and a second pair of values assigns an associated second resistance value of the resistance heating device to a second temperature value of the resistance heating device. For example, a linear relationship between the electrical resistance and the temperature of the resistance heating device can be derived from at least two pairs of values. Particularly, a resistance temperature characteristic curve can be derived from two pairs of values, which curve defines the relationship between the electrical resistance and the temperature of the resistance heating device. The relationship between the electrical resistance and the temperature of the resistance heating device can also be described by means of a temperature coefficient of the electrical resistance. The first and/or the second temperature value of the resistance heating device can be detected by sensor by means of the temperature sensor. The first and/or the second resistance value of the resistance heating device can be detected by means of a measuring device, particularly an electrical measuring circuit, of the device.

In a further preferred embodiment of the device according to the invention, it is designed to determine the first pair of values and/or the second pair of values itself. The temperature of the resistance heating device is preferably kept constant for a stabilization period before a pair of values is determined, until the temperature value and the resistance value have stabilized. The first or the second temperature value can be a set temperature target value of the resistance heating device. Such a temperature target value is maintained over a longer period of time so that the corresponding temperature and/or resistance values can level off. The first or the second temperature value can be a temperature value of the resistance heating device, which is set when the device is not in operation. This temperature value then essentially corresponds to the ambient temperature. In this case, it is to be ensured that the entire resistance heating device has cooled down evenly to the ambient temperature. The first pair of values and/or the second pair of values can be determined, for example, as part of a setup routine, particularly at the manufacturer, preferably when the relationship between the electrical resistance and the temperature of the resistance heating device is initially stored. The first pair of values and/or the second pair of values can be determined, for example, during regular operation of the device, particularly when the relationship between the electrical resistance and the temperature of the resistance heating device is subsequently changed or updated.

Furthermore, a device according to the invention is advantageous in which an initial relationship between the electrical resistance and the temperature of the resistance heating device is stored in a memory of the electronic data processing and/or control device, wherein the electronic data processing and/or control device is designed to check the stored initial relationship between the electrical resistance and the temperature of the resistance heating device during commissioning and/or to adapt it specifically for the resistance heating device. There is thus a check of the factory-stored initial relationship between the electrical resistance and the temperature of the resistance heating device for its validity for the specific device when it is first commissioned.

In a further preferred embodiment of the device according to the invention, the electronic data processing and/or control device is designed, before or during commissioning of the device, to determine the initial relationship between the electrical resistance and the temperature of the resistance heating device and to store it in the memory, from a first initial pair of values stored in the memory, which first initial pair of values assigns an associated first resistance value of the resistance heating device to a first temperature value of the resistance heating device, and a calculated second initial pair of values, which assigns an associated second resistance value of the resistance heating device to a second temperature value of the resistance heating device.

The first initial pair of values was preferably determined by the device itself at the end of the manufacturing process and stored in the memory for use during commissioning. The temperature value of the first initial pair of values preferably relates to the ambient temperature of the device at the end of the manufacturing process, that is, for example, to the hall temperature of the manufacturing site. The second initial pair of values is preferably calculated by the electronic data processing and/or control device on the basis of known properties of the undamaged resistance heating device in relation to a set-point temperature. Both a quick test during the manufacture of the device and, moreover, safe operation from the first use of the device can be ensured in this way. When the device is used for the first time, before the heating mode is activated, the resistance value of the resistance heating device is also detected in order to check whether the resistance heating device has the same properties as during manufacture and is therefore undamaged.

In a further embodiment of the device according to the invention, the electronic data processing and/or control device is designed to compare at least one pair of values of the relationship between the electrical resistance and the temperature of the resistance heating device during operation with a pair of values determined by the device during operation of the device. A slow or creeping offset development in the temperature detection by the temperature sensor can be determined in this way. If the comparison of the deviation shows that the deviation lies outside a tolerance range, this indicates an increasing measurement deviation at the temperature sensor or damage to the resistance heating device.

The device according to the invention is further developed advantageously by an electrical measuring circuit designed to detect the current resistance value of the resistance heating device. The electrical measuring circuit preferably comprises a high-side switch designed to switch the positive supply voltage. In this case, switching takes place above the load. The electrical measuring circuit preferably comprises a low-side switch designed to switch the negative supply voltage. In this case, switching takes place below the load. The electrical measuring circuit comprises particularly an electrical resistor and a field effect transistor, which generate an overlay voltage or an overlay current. In addition, the electrical measuring circuit can have a voltage divider for protecting the electronic data processing and/or control device.

The object on which the invention is based is further achieved by a heating system of the type mentioned at the beginning, wherein the device for determining the temperature of the resistance heating device is designed according to one of the embodiments described above. With regard to the advantages and modifications of the heating system according to the invention, reference is first made to the advantages and modifications of the device according to the invention for detecting the temperature of a resistance heating device.

The heating system can be used, for example, in a heatable vehicle seat for heating the buttocks contact surface and/or for heating the back contact surface of the vehicle seat.

In a preferred embodiment of the heating system according to the invention, the resistance heating device is designed as a heating conductor system and comprises one or more heating conductors. The one or more heating conductors can be designed as heating wires.

The object on which the invention is based is further achieved by a method of the type mentioned at the beginning, wherein the method according to the invention comprises calculating a temperature change of the resistance heating device on the basis of a change in the resistance value of the resistance heating device and a relationship between the electrical resistance and the temperature of the resistance heating device by means of electronic data processing and/or control device of the heating system. Furthermore, the method according to the invention comprises validating the temperature of the resistance heating device detected by the temperature sensor, taking into account the calculated temperature change of the resistance heating device.

A heating system according to one of the embodiments described above is preferably operated by means of the method according to the invention.

The relationship between the electrical resistance and the temperature of the resistance heating device used by the electronic data processing and/or control device is preferably a device-specific relationship between the electrical resistance and the temperature of the resistance heating device determined specifically for the resistance heating device.

In a preferred embodiment of the method according to the invention, the electronic data processing and/or control device compares a sensor-detected temperature change of the resistance heating device with the calculated temperature change of the resistance heating device for validating the sensor-detected temperature of the resistance heating device.

In addition, a method according to the invention is advantageous in which the relationship between the electrical resistance and the temperature of the resistance heating device used for the temperature calculation is determined by the electronic data processing and/or control device, particularly as part of a setup routine. Alternatively or additionally, the method comprises the initial storage of the relationship between the electrical resistance and the temperature of the resistance heating device used for the temperature calculation by the electronic data processing and/or control device, particularly as part of a setup routine. In addition, the method can comprise the subsequent changing, particularly updating, of the relationship between the electrical resistance and the temperature of the resistance heating device used for the temperature calculation by the electronic data processing and/or control device, particularly as part of a setup routine. The relationship between the electrical resistance and the temperature of the resistance heating device is preferably derived from at least two pairs of values, wherein a first pair of values assigns an associated first resistance value of the resistance heating device to a first temperature value of the resistance heating device and a second pair of values assigns an associated second resistance value of the resistance heating device to a second temperature value of the resistance heating device. The method preferably comprises determining the first pair of values and/or the second pair of values by the heating system.

In a further preferred embodiment of the method according to the invention, the electronic data processing and/or control device checks an initial relationship between the electrical resistance and the temperature of the resistance heating device, which relationship is stored in a memory of the electronic data processing and/or control device, particularly when the heating system is commissioned. Alternatively or additionally, an initial relationship between the electrical resistance and the temperature of the resistance heating device, which relationship is stored in a memory of the electronic data processing and/or control device, is specifically adapted by the electronic data processing and/or control device, particularly when the heating system is commissioned. A method is also preferred in which an initial relationship between the electrical resistance and the temperature of the resistance heating device is determined by the electronic data processing and/or control device, from a first initial pair of values stored in a memory of the electronic data processing and/or control device, which pair of values assigns an associated first resistance value of the resistance heating device to a first temperature value of the resistance heating device and a calculated second initial pair of values which assigns an associated second resistance value of the resistance heating device to a second temperature value of the resistance heating device, particularly before or during commissioning of the heating system. The method can further comprise storing the determined initial relationship between the electrical resistance and the temperature of the resistance heating device in the memory of the electronic data processing and/or control device. Alternatively or additionally, at least one pair of values of the relationship between the electrical resistance and the temperature of the resistance heating device is compared with a pair of values determined by the heating system during operation of the heating system. Furthermore, the current resistance value of the resistance heating device can be detected by an electrical measuring circuit of the heating system.

BRIEF DESCRIPTION OF THE DRAWINGS

Preferred embodiments of the invention are explained and described in more detail below with reference to the accompanying drawings. Shown are.

DETAILED DESCRIPTION

Figure 1:
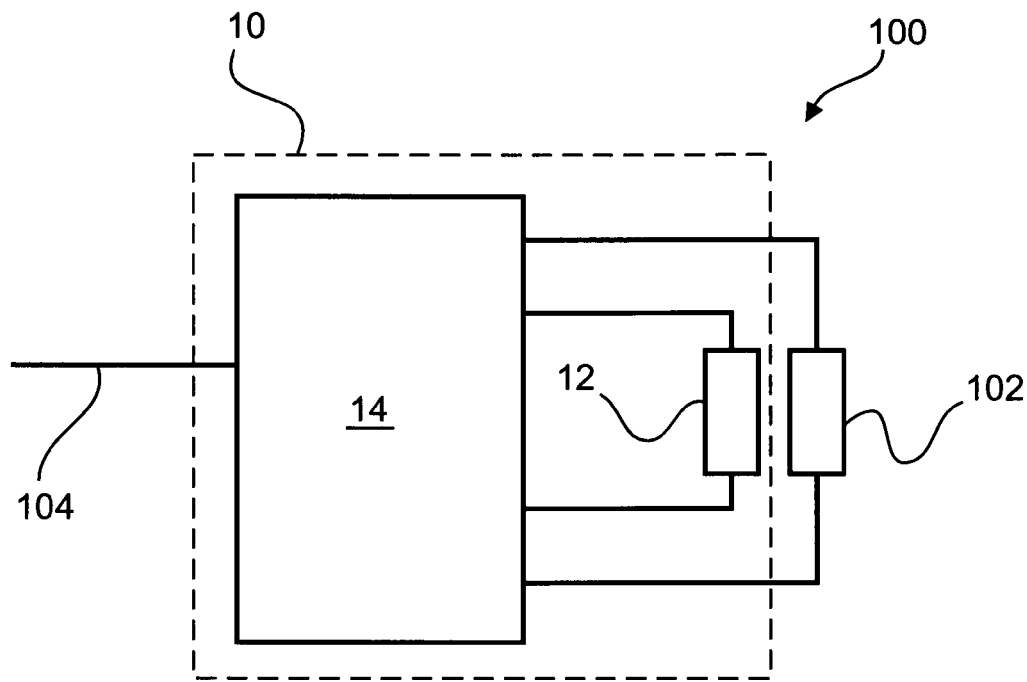
FIG. 1 illustrates an embodiment of the heating system according to the invention in a schematic representation.

FIG. 1 shows a heating system 100 which can be used in connection with a vehicle. For example, the illustrated heating system 100 can be at least partially integrated into a vehicle seat in order to implement a heating function on the vehicle seat.

The heating system 100 has a resistance heating device 102 designed as a heating conductor system. Accordingly, the resistance heating device 102 has one or more heating conductors. In addition, the heating system 100 comprises a device 10 for determining the temperature of the resistance heating device 102.

The device 10 allows redundant temperature detection, so that the risk of incorrect temperature detection is minimized. The device 10 has a temperature sensor 12 arranged in the vicinity of the resistance heating device 102. Alternatively, the temperature sensor 12 can also be arranged directly on the resistance heating device 102 and be in contact with the resistance heating device 102. The thermal coupling of the temperature sensor 12 and the resistance heating device 102 allows the temperature of the resistance heating device 102 to be detected by sensor by means of the temperature sensor 12. The temperature sensor 12 and the resistance heating device 102 are electrically conductively connected to an electronic data processing and/or control device 14 of the device 10. The electronic data processing and/or control device 14 can be designed as a microcontroller and is used, among other things, for validating the temperature of the resistance heating device 102 detected by sensor by the temperature sensor 12.

To validate the temperature of the resistance heating device 102 detected by sensor by the temperature sensor 12, the electronic data processing and/or control device 14 calculates a temperature change of the resistance heating device 102 on the basis of a change in the resistance value of the resistance heating device 102 and a relationship 26, 26a-26c between the electrical resistance R and the temperature T of the resistance heating device 102. The temperature change of the resistance heating device 102 calculated on the basis of the change in resistance is compared with a temperature change of the resistance heating device 102 detected by sensor as part of the measured value validation. If the temperature change of the resistance heating device 102 detected by sensor by the temperature sensor 12 corresponds to the temperature change of the resistance heating device 102 calculated by the electronic data processing and/or control device 14 or does not exceed a tolerance deviation, a first group of malfunctions of the temperature sensor 12 can already be excluded within the scope of the validation. Malfunctions that lead to dynamic or varying measured value deviations, such as a short circuit or an open circuit in the region of the temperature sensor 12, can be reliably determined by comparing the temperature change determined and calculated by the sensors.

The electronic data processing and/or control device 14 is further designed to update the relationship 26, 26a-26c used for the temperature calculation between the electrical resistance R and the temperature T of the resistance heating device 102 during operation. A constant recalibration of the electronic data processing and/or control device 14 takes place during the operation of the device 10 due to the constant updating of the relationship 26, 26a-26c between the electrical resistance R and the temperature T of the resistance heating device 102. In this way, a constant temperature deviation or a constant temperature offset can also be identified by the temperature sensor 12 in the sensor-based temperature detection. The first validation process, which is implemented by comparing the temperature changes detected by sensor and the calculated temperature changes, is thus supplemented by constantly recalibrating the electronic data processing and/or control device 14 for updating the relationship 26, 26a-26c between the electrical resistance R and the temperature T of the resistance heating device 102. Overall, a reliable measurement value validation can thus be implemented without the need for additional temperature sensors.

The relationship 26, 26a-26c used by the electronic data processing and/or control device 14 between the electrical resistance R and the temperature T of the resistance heating device 102 is a device-specific relationship, determined specifically for the resistance heating device 102, between the electrical resistance R and the temperature T of the resistance heating device 102. This relationship 26, 26a-26c, specially adapted to the resistance heating device 102, between the electrical resistance R and the temperature T of the resistance heating device 102, can be determined as part of a setup routine of the device 10 by the manufacturer or automatically when the device 10 is commissioned.

The heating system 100 can be integrated into an electrical system of a vehicle via the line 104.

Figure 2:
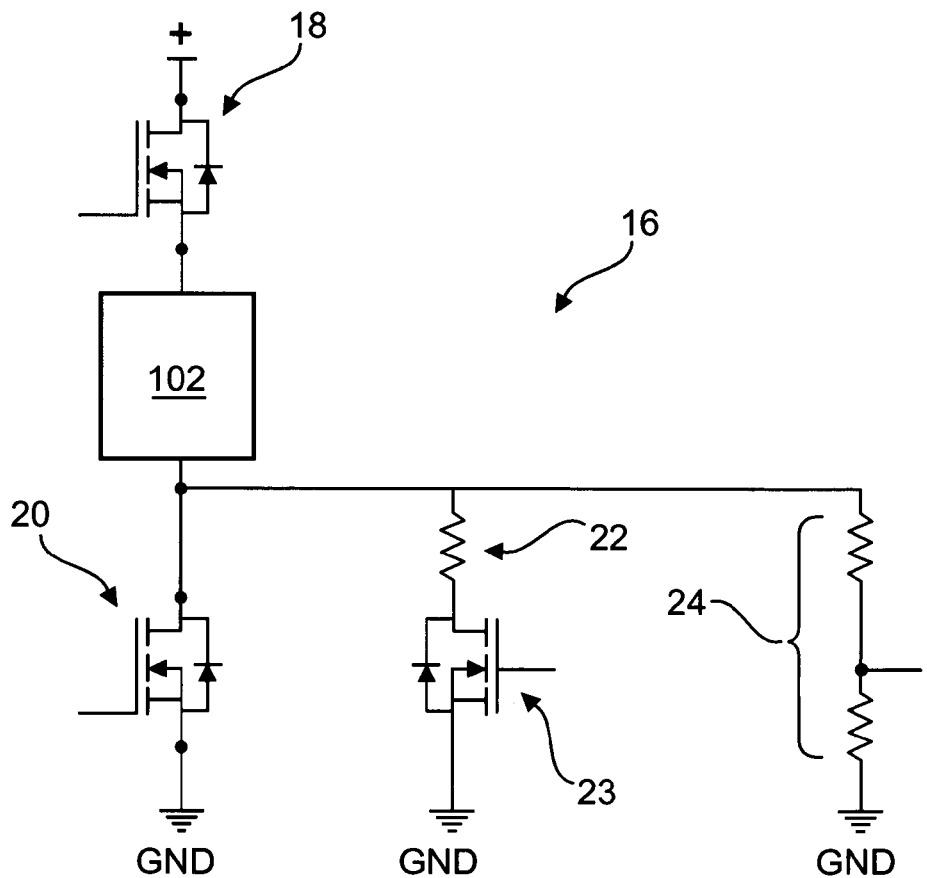
FIG. 2 illustrates a resistance heating device and a measuring circuit of a device according to the invention for determining the temperature of the resistance heating device.

FIG. 2 shows an electrical measuring circuit 16 by means of which the current resistance value of the resistance heating device 102 can be detected. The electrical measuring circuit 16 comprises a high-side switch 18 designed to switch the positive supply voltage. Furthermore, the electrical measuring circuit 16 comprises a low-side switch 20 designed to switch the negative supply voltage. In addition, the electrical measuring circuit 16 comprises an electrical resistor 22 and a field effect transistor 23 which generate an overlay voltage or an overlay current. In addition, the electrical measuring circuit 16 comprises a voltage divider 24 used to protect the electronic data processing and/or control device 14.

Figure 3:
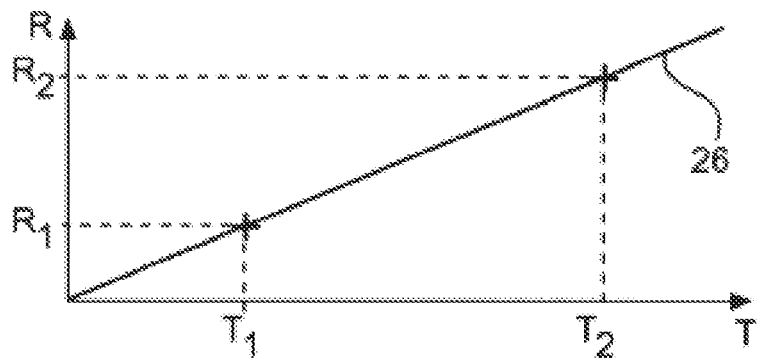
FIG. 3 illustrates a relationship between the electrical resistance and the temperature of a resistance heating device determined within the scope of the method according to the invention.

FIG. 3 shows a relationship 26 between the electrical resistance R and the temperature T of a resistance heating device 102 used by the electronic data processing and/or control device 14 for calculating the temperature. The electronic data processing and/or control device 14 derives the relationship 26 between the electrical resistance R and the temperature T of the resistance heating device 102 from two pairs of values. The first pair of values assigns an associated first resistance value $R_1$ of the resistance heating device 102 to a first temperature value $T_1$ of the resistance heating device 102. A second pair of values assigns an associated second resistance value $R_2$ of the resistance heating device 102 to a second temperature value $T_2$ of the resistance heating device 102. The temperature measured values $T_1$, $T_2$ of the resistance heating device 102 can be detected by means of the temperature sensor 12 of the device 10 and/or calculated via the electronic data processing and/or control device 14 of the device 10. The resistance values $R_1$, $R_2$ of the resistance heating device 102 can be detected by means of the measuring circuit 16 of the device 10.

From the two pairs of values, the electronic data processing and/or control device 14 calculates the linear relationship 26 between the electrical resistance R and the temperature T of the resistance heating device 102, wherein this is a linear resistance temperature characteristic curve in the present case.

Figure 4A:
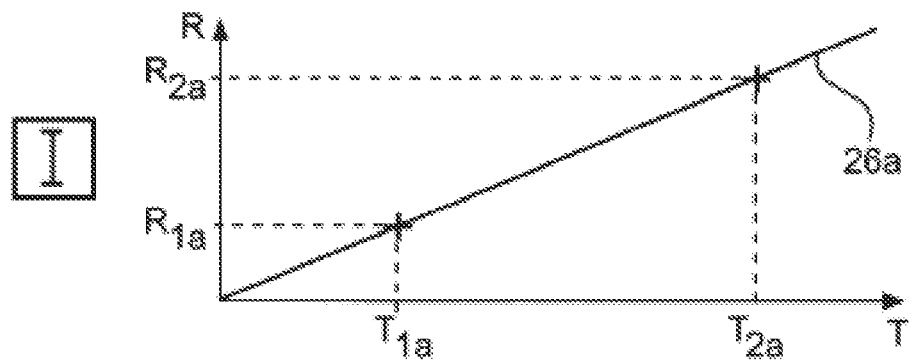
FIGS. 4A, 4B, and 4C illustrate different relationships between the electrical resistance and the temperature of a resistance heating device, stored on a device according to the invention, before and after commissioning.
Figure 4B:
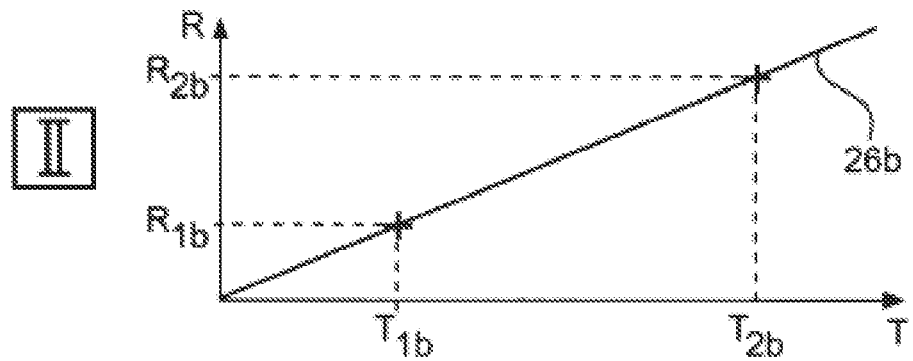
Figure 4C:
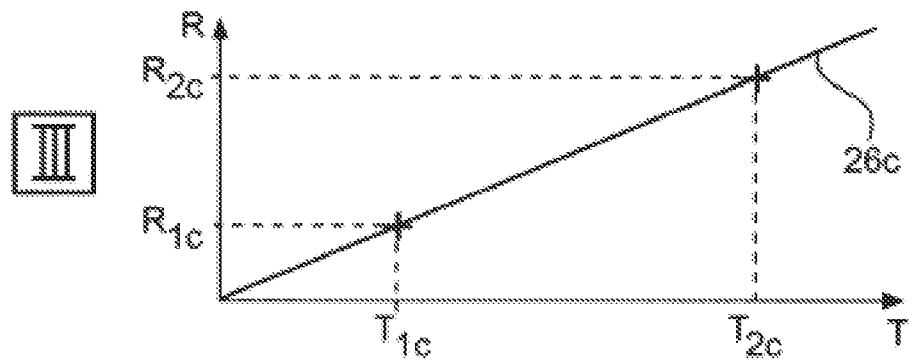

FIGS. 4A, 4B, and 4C show three different relationships 26a-26c between the electrical resistance R and the temperature T of a resistance heating device 102 at different points in time I-III in FIG. 4A, the point in time I relates to the point in time at which the manufacturing process of the device 10 is completed. In FIG. 4B, the point in time II relates to the commissioning of the device 10, that is, to the point in time when the device 10 is used for the first time.

In FIG. 4C, the point in time III relates to a later operating point in time after the device 10 has been commissioned.

The electronic data processing and/or control device 14 is designed to determine a first initial pair of values from a resistance value $R_{1a}$ and a temperature value $T_{1a}$ after completion of the manufacturing process and to store it in a memory of the electronic data processing and/or control device 14. The temperature value $T_{1a}$ of the first initial pair of values relates, for example, to the ambient temperature of the device 10 at the end of the manufacturing process, that is, to the hall temperature of the manufacturing site. The second initial pair of values from the temperature value $T_{2a}$ and the resistance value $R_{2a}$ is calculated by the electronic data processing and/or control device 14 before the device 10 is commissioned on the basis of known properties of the undamaged resistance heating device 102. The temperature value $T_{2a}$ relates, for example, to a set-point temperature which is likely to be set during the later operation of the device 10.

The electronic data processing and/or control device 14 can thus determine an initial relationship 26a between the electrical resistance R and the temperature T of the resistance heating device 102 even before the device 10 is commissioned. This initial relationship 26a between the electrical resistance R and the temperature T of the resistance heating device 102 allows a quick test of the temperature sensor 12 after the manufacturing process has been completed and the device 10 has actually been commissioned (see FIG. 4A).

FIG. 4B shows a relationship 26b between electrical resistance R and temperature T of resistance heating device 102, which relationship is determined when the device 10 is commissioned by electronic data processing and/or control device 14 and is used for updating the diagram 26a. The electronic data processing and/or control device 14 determines two resistance values $R_{1b}$, $R_{2b}$ at two different temperatures $T_{1b}$, $T_{2b}$ when it is commissioned. During commissioning, the electronic data processing and/or control device 14 thus causes an update of the initial relationship 26a stored within the framework of the setup routine by the relationship 26b determined when the device 10 was commissioned.

In addition, the electronic data processing and/or control device 14 is designed to compare at least one pair of values of the relationship 26b between the electrical resistance R and the temperature T of the resistance heating device 102 when the device 10 is in operation with a pair of values that is determined in the device 10. If a creeping offset development is determined in the temperature detection by the temperature sensor 12, the electronic data processing and/or control device 14 causes the relationship 26b to be updated again, wherein the new relationship 26c is determined as part of the update. Two pairs of values $T_{1c}$, $R_{1c}$ and $T_{2c}$, $R_{2c}$ are again determined and used to calculate the new resistance temperature characteristic curve 26c.

Because the electronic data processing and/or control device 14 can update the relationship 26a, 26b, 26c between the electrical resistance R and the temperature T of the resistance heating device 102, a reliable validation process of the temperature measurement values determined by the temperature sensor 12 can be ensured even with changing device properties. The temperature calculation thus continues to be precise, both in the delivery state of the device 10 and after the occurrence of closure, so that additional temperature sensors for the purpose of validation can be completely dispensed with.

REFERENCE NUMBERS 10 device
12 temperature sensor
14 electronic data processing and/or control device
16 measurement circuit
18 high-side switch
20 low-side switch
22 resistor
23 field effect transistor
24 voltage divider
26, 26a-26c relationships
100 heating system
102 resistance heating device
104 line
T temperature
$T_1$, $T_2$ temperature values
$T_{1a}$, $T_{2a}$ temperature values
$T_{1b}$, $T_{2b}$ temperature values
$T_{1c}$, $T_{2c}$ temperature values
R electrical resistance
$R_1$, $R_2$ resistance values
$R_{1a}$, $R_{2a}$ resistance values
$R_{1b}$, $R_{2b}$ resistance values
$R_{1c}$, $R_{2c}$ resistance values
I-III points in time

The invention claimed is:

1. A heating system for use in a vehicle comprising:
a resistance heating device; and
a device for determining a temperature of the resistance heating device, the device comprises,
a temperature sensor configured to detect the temperature of the resistance heating device; and
an electronic data processing and/or control device configured to calculate a temperature change of the resistance heating device on a basis of a change in a resistance value of the resistance heating device and a relationship between resistance value and the temperature of the resistance heating device, the electronic data processing and/or control device being configured to validate the temperature of the resistance heating device detected by the temperature se or taking into account the calculated temperature change of the resistance heating device,
wherein the electronic data processing and/or control device is configured to derive the relationship between the resistance value and the temperature of the resistance heating device from at least of ues wherein first pair of the at least two pairs of values assigns an associated first resistance value of the resistance heating device to a first temperature value of the resistance heating device and a second pair of the at least two pairs of values assigns a second resistance value of the resistance heating device to a second temperature value of the resistance heating device; and
wherein the first pair of the at least two pairs of values is determined by the device itself at an end of a manufacturing process of the device, the first pair of the at least two pair of values is a hall temperature of a manufacturing site of the device and is stored in a memory of the electronic data processing and/or control device during commissioning of the device, and the second pair of the at least wo pairs of values is calculated by the electronic data processing and/or control device based on known properties of the resistance heating device in relation to a set-point temperature; and an electrical measuring circuit is configured to detect the current resistance value of the resistance heating device.

2. The heating system according to claim 1, wherein the electronic data processing and/or control device is configured to compare a sensor-detected temperature change of the resistance heating device with the calculated temperature change of the resistance heating device to validate a sensor-detected temperature of the resistance heating device.

3. The heating system according to claim 1, wherein the relationship used by the electronic data processing and/or control device between the resistance valve and the temperature of the resistance heating device is a device-specific relationship determined specifically for the resistance heating device between the resistance valve and the temperature of the resistance heating device.

4. The heating system according to claim 1, wherein the electronic data processing and/or control device is configured to determine and/or to initially store the relationship used for the temperature calculation between the resistance value and the temperature of the resistance heating device as part of a setup routine.

5. The heating system according to claim 1, wherein the electronic data processing and/or control device is configured to subsequently update the relationship between the resistance value and the temperature of the resistance heating device used for the temperature calculation.

6. The heating system according to claim 1, wherein the resistance heating device is designed as a heating conductor system and comprises one or more heating conductors.

7. The heating system according to claim 1, wherein when the device is first used before a heating mode is activated, the resistance value of the resistance heating device is detected to check if the resistance heating device has same properties during the manufacturing process.

* * * * *

UNITED STATES PATENT AND TRADEMARK OFFICE
CERTIFICATE OF CORRECTION

| | |
|---|---|
| PATENT NO. | : 12,351,002 B2 |
| APPLICATION NO. | : 17/606534 |
| DATED | : July 8, 2025 |
| INVENTOR(S) | : David Szabolcs Simon |

Page 1 of 1

It is certified that error appears in the above-identified patent and that said Letters Patent is hereby corrected as shown below:

In the Claims

Column 11, Line 42, Claim 1, delete "termperature se or" and insert -- temperature sensor --

Signed and Sealed this
Twenty-seventh Day of January, 2026

John A. Squires
*Director of the United States Patent and Trademark Office*